United States Patent
Frauscher

(12) 
(10) Patent No.: US 6,759,855 B2
(45) Date of Patent: Jul. 6, 2004

(54) DEVICE FOR MONITORING AND FORECASTING THE PROBABILITY OF INDUCTIVE PROXIMITY SENSOR FAILURE

(75) Inventor: Josef Frauscher, St. Marienkirchen (AT)

(73) Assignees: VAE Eisenbahnsysteme Gmbh, Zeltweg (AT); VAE Aktiengesellschaft, Vienna (AT)

(*) Notice: Subject to any disclaimer, the term of this patent is extended or adjusted under 35 U.S.C. 154(b) by 0 days.

(21) Appl. No.: 10/203,868

(22) PCT Filed: Feb. 15, 2001

(86) PCT No.: PCT/AT01/00037

§ 371 (c)(1),
(2), (4) Date: Oct. 9, 2002

(87) PCT Pub. No.: WO01/63309

PCT Pub. Date: Aug. 30, 2001

(65) Prior Publication Data

US 2003/0052663 A1 Mar. 20, 2003

(30) Foreign Application Priority Data

Feb. 23, 2000 (AT) ............................................ 281/2000

(51) Int. Cl.[7] .............................................. G01R 27/28
(52) U.S. Cl. ................... 324/654; 324/207.12; 324/655
(58) Field of Search ........................ 324/207.12, 207.16, 324/207.26, 236, 654, 655; 340/551, 593, 644

(56) References Cited

U.S. PATENT DOCUMENTS

| | | | |
|---|---|---|---|
| 4,433,309 A | * | 2/1984 | Hermle et al. ................. 331/65 |
| 4,492,925 A | * | 1/1985 | Kammerer et al. .......... 324/418 |
| 4,525,699 A | | 6/1985 | Buck et al. |
| 4,652,819 A | * | 3/1987 | Kammerer .............. 324/207.26 |
| 4,987,366 A | * | 1/1991 | Hamel .................... 324/207.26 |
| 5,450,059 A | * | 9/1995 | Arroubi et al. .............. 340/515 |
| 6,164,600 A | * | 12/2000 | Seidl et al. .................. 246/220 |
| 6,424,146 B2 | * | 7/2002 | Demma et al. .......... 324/207.16 |

FOREIGN PATENT DOCUMENTS

| | | | |
|---|---|---|---|
| DE | 31 10390 A1 | 10/1982 | .......... H03K/17/94 |
| DE | 32 20 111 C1 | 6/1983 | ......... H03K/17/945 |
| DE | 33 42 710 C1 | 1/1985 | ......... H03K/17/945 |
| DE | 33 27 188 A1 | 2/1985 | ............ G01R/31/28 |

* cited by examiner

Primary Examiner—N. Le
Assistant Examiner—Walter Benson
(74) Attorney, Agent, or Firm—Chapman and Cutler LLP

(57) ABSTRACT

In a device for the monitoring and the prognosis of the failure probability of inductive proximity sensors (1) for the monitoring of the position of movable switch rails or rail components, in which the proximity sensor (1) has at least one coil (5) that is supplied by an oscillator (7), and the sensor current flowing by means of variable attenuation is measured and then fed to an evaluation circuit, characteristic lines (18, 22) of the sensor (1) are stored for the course of the sensor currents in dependency of the distance of the movable switch rails or rail components, i.e. the mechanical attenuation in an electric not additionally attenuated condition, and in an electric additionally attenuated condition. The measurement currents (22) corresponding to a mechanical attenuation condition (18), as well as to respective additionally electric attenuated condition are cyclic scanned. The respective measurement currents, or measurement reading pairs are fed to a comparison or evaluation circuit, in which the differences resulting from the characteristic lines are compared to the measured differences.

24 Claims, 2 Drawing Sheets

Figure 1:
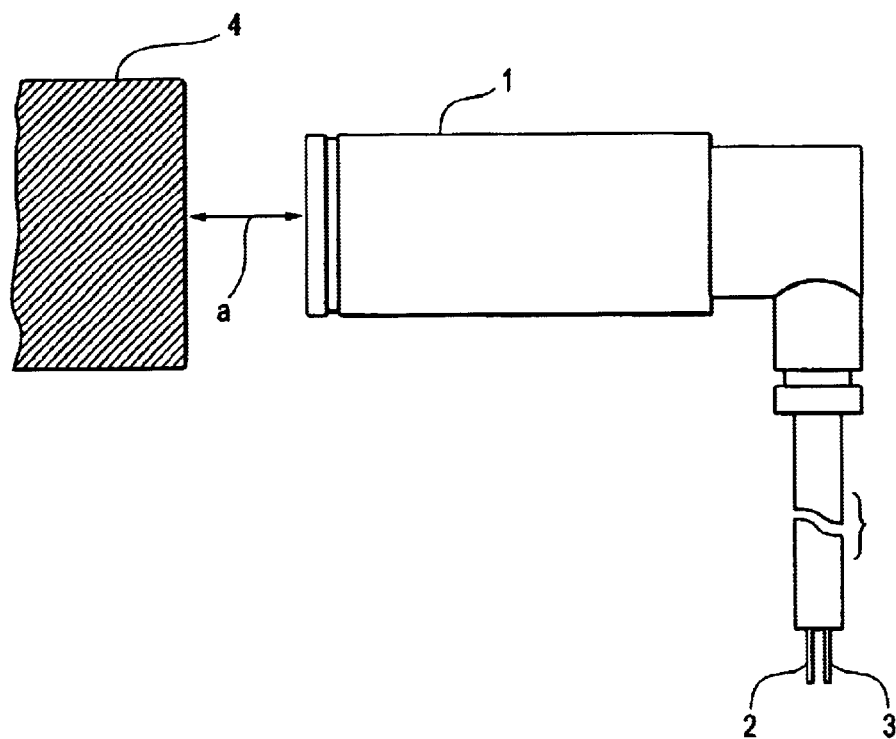

DEVICE FOR MONITORING AND FORECASTING THE PROBABILITY OF INDUCTIVE PROXIMITY SENSOR FAILURE

The invention relate to a device for the monitoring and prognosis of the failure probability of inductive proximity sensors for monitoring of the position of movable switch rails or rail components, in which the proximity sensor has at least one coil supplied by an oscillator, and the sensor current flowing by means of variable attenuation is measured and then fed to an evaluation circuit.

For the monitoring of the assembly, or disassembly of tongues on jaw rails, inductive sensors may be used, for example. In order to grasp the assembly of the tongue on a jaw rail, the inductive sensor may be attached in the rack of the jaw rail, whereby either the non-attenuated condition of this sensor, or an additional, specifically designed inductive sensor may be used for the assembly of the tongue. Such sensors deliver a certain current depending on the attenuation, and the current reception of the sensor can be monitored, and the distance information can be gained in this way. A method for the monitoring of the condition of switch rails is known from AT 399 851 B, in which additional signals gained during the riding of the switch rails are evaluated, and the smallest reading of each distance is stored, whereby the change of the smallest reading measured, as well as at least a first threshold reading for the smallest distance are compared to one another. A premature wear in the area of the tongue rail of a switch rail should be able to be recognized in this way. It was recommended in WO 97/33784 to design the sensor as a continuous proximity sensor, and to perform two separate evaluations, whereby one evaluation is to yield each distance, and the second evaluation a functional control of the sensor, whereby the predetermined tolerance windows of the characteristic line are considered the standard.

Generally, the sensors designed as continuous proximity sensors are mostly designed as inductive sensors, whereby a coil with a freely oscillating oscillator is used, the resonant amplitude of which changes with the proximity of ferromagnetic, or electrically conductive material, whereby a corresponding change of the current consumption can be measured. The corresponding proximity information can be gained in an evaluation circuit from the measured currency consumption.

In order to monitor the correct function of inductive proximity sensors, it has already been recommended in DE-C-1 50 212 to use test signals. By means of such test signals, an electric attenuation, or de-attenuation should be achieved, whereby the evaluation of the change in the signal with engaged test signal, and without test signal should result in an evaluation of the availability of the proximity sensor. With such circuit arrangements it can be principally recognized whether a sensor was correctly connected, and particularly, whether a sensor is defect, as the engagement of a test signal does not show any changes in this case, that can be evaluated.

The invention aims to create a device for the monitoring and the prognosis of the failure probability of inductive proximity sensors for the monitoring of the position of movable switch rails or rail components, in which the principle of the known test attenuation is used, but whereby a self test device is to be created for inductive proximity sensors for the entire signal behavior, in order to generate a failure prognosis for the sensor from the changes of a possible characteristic line course. Possible causes for an increased failure probability are particularly a decrease in the isolation resistance between the conductors by water penetration, and therefore a formation of parasitic resistances, mechanical damage, or damage to the assembly components in the circuit, as well as errors in the sensor electronics, which lead to a change in the proximity current characteristic line, whereby the wrong proximity information would be gathered. The inventive device should show such changes in a timely fashion so that the maintenance, or the exchange of a sensor can occur long before its actual failure. In order to solve this task, the inventive device essentially consists of the fact that characteristic lines of the sensor are stored in the electric not additionally attenuated condition, and in the electric additionally attenuated condition for the course of the sensor currents in dependency of the distance of the movable switch rails, or rail components, i.e. the mechanical attenuation, and that the measuring currents corresponding to the mechanical attenuation condition, as well as to the respective additionally electric attenuated condition are cyclic scanned, and the respective measuring currents, or measurement reading pairs are fed to a comparison and evaluation circuit, in which the differences due to the characteristic line are compared to the measured differences. Inductive sensors are usually removed after the adjustment, whereby a characteristic line of the sensor is received for the various positions of the tongue relative to the jaw rail. Due to he fact that this characteristic line, as well as an additional characteristic line, in which the sensor was additionally electrically attenuated, are received, and both of these characteristic lines are stored, it is subsequently possible to make predictions for the failure probability independently of the respective position of the tongue relative to the jaw rail. Normally, a defective sensor in a non-attenuated condition will have a clearly distinguishable signal as opposed to an intact sensor. In a maximum mechanically non-attenuated condition of such a sensor it has been shown, however, that the signals of a defective sensor essentially cannot be differentiated from the signals of an intact sensor. Not until the actual checking of the measurement readings for an electrically attenuated circuit arrangements can the differences between intact sensors and defective sensors be clearly recognized, if a respective comparison with the original characteristic lines of the intact sensor is performed for this purpose. For this purpose, the invention suggests that the measuring currents corresponding to a mechanical attenuation condition, as well as the corresponding additional electrically attenuated measuring currents are cyclic scanned and the respective measuring currents, or the measurement reading pairs are fed to a comparison and evaluation circuit. In such a comparison and evaluation circuit, an evaluation can subsequently be performed by means of the stored characteristic lines, whereby the differences to the differences due to the characteristic lines of the intact sensors enable a corresponding prognosis of the failure probability.

In a particularly advantageous way, the embodiment is chosen so that the signals of the measurement reading pairs for at least to different mechanical attenuations are fed to the evaluation circuit. It was shown across the entire signal course that the difference of the measurement readings for an intact sensor and a defective sensor in the electrically non-attenuated condition depends on the actual position, and thereby on the distance of the measurement object. It was particularly shown that this difference is larger with maximum mechanical attenuation, than with minimum mechanical attenuation, i.e. with a disassembled tongue. This behavior of the characteristic line of the intact, and that of a defective sensor without electric attenuation directly results in the fact that exact statements on the extent of a defect cannot be made across a large partial area of the characteristic line, as the difference between the signals of an intact and that of a defective sensor is not significant. Significant changes only appear in the maximum mechanically attenuated position, however whereby here, without the assistance of the characteristic line of an electrically attenuated sensor, the wrong proximity readings could be achieved, as particularly a measuring current that is too low would already signalize an attachment position already at a distance to the attachment, and corresponds to the measuring current that corresponds to the attachment of a tongue on a jaw rail in an intact sensor. Not until the comparison with the measurement readings and the characteristic lines of an additional electrically attenuated sensor, are such differences able to be evaluated, and allow the corresponding conclusions to the errors and the failure probability.

In a particularly simple way, the electric attenuation may occur by means of an increase in supply voltage. This is especially recommended for the use of the so-called two-wire technology, in which a statistical decrease of the failure probability occurs due to the decrease of the amount of electric wires. The circuit for the determination of the additional electric attenuated signal can be advantageously designed so that the electric attenuation occurs by means of a tap of the sensor coil, whereby a transistor is advantageously intended that controls the electric attenuation by means of a resistance at the tap of the sensor coil, the base of which is connected to the voltage source by moans of a Z diode. By simply increasing the supply voltage, the direct switching in of the electric attenuation, and obtaining merely the measuring reading for an exclusive mechanical attenuation by means of decreasing the supply voltage can be achieved in a simple way. In an advantageous way it is proceeded in such a way that at least one evaluation of the difference of the measurement reading pairs occurs in a mechanically non-attenuated position, whereby the evaluation may occur in such a way that a respective constant current is measured at a respective distance.

By means of the cyclic switching in of a resistance to the resonant circuit, an attenuation of the resonant circuit defined in size therefore occurs, and by mews of the switching in by increasing the supply voltage, the reach may be found with merely two wires. Functionally seen, the attenuation by the sensor housing, assembly and measurement subjects, is the loss of eddy currents that lead to a decrease of the resonant amplitude of the oscillator as losses of effect, and therefore to a decrease of current consumption.

The effect of a resistance parallel to the resonant circuit equals the affect of eddy current losses, and almost every sensor error leading to a change in the signal behavior can be determined by means of a cyclic test attenuation, and a corresponding evaluation of the sensor current in this way.

By means of making a comparison with the corresponding characteristic lines, a prognosis may also be achieved with regard to the sensor behavior in the attenuation by the measurement object, i.e. in the attenuation by the tongue moving from the assembly to the disassembly. When such a prognosis does not achieve the expected sensor current, a sensor error may be the conclusion.

Figure 3:
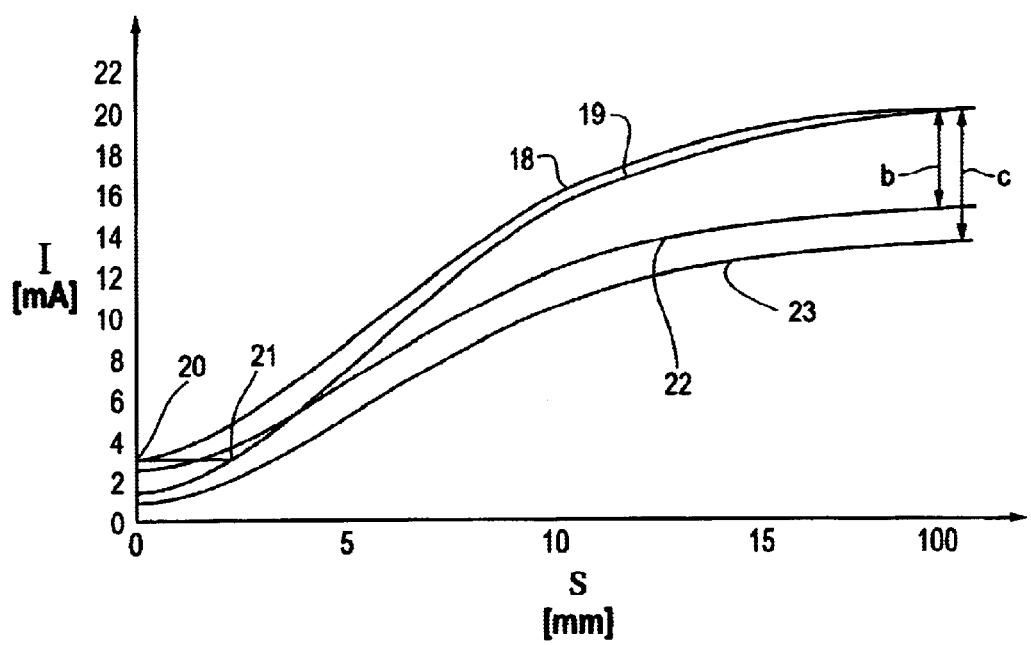
Figure 4:
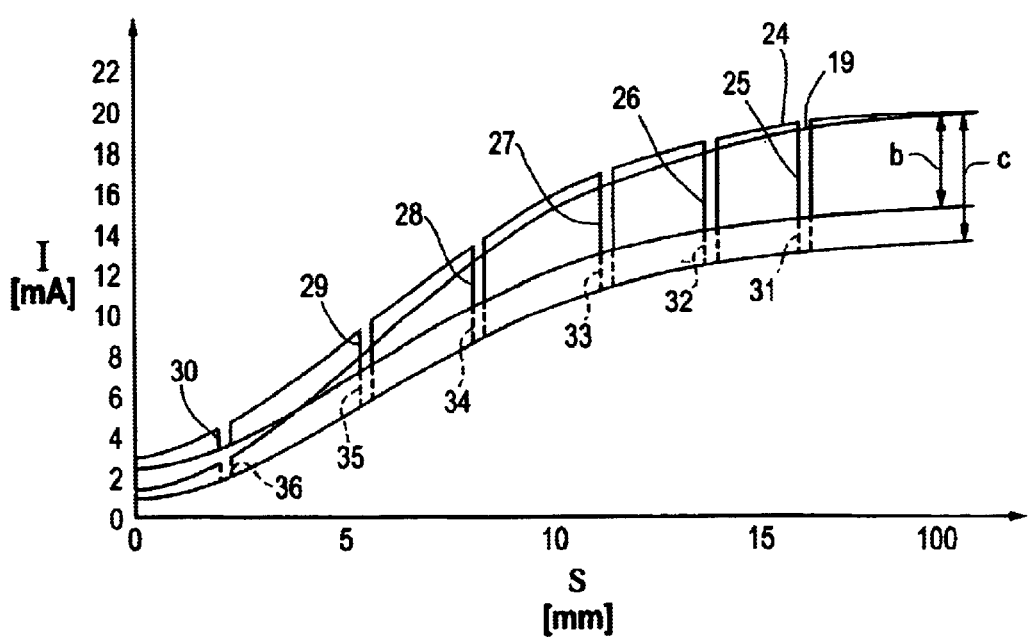

The invention is explained in further detail below according to the drawings. They show in FIG. 1 a schematic measurement arrangement of an inductive sensor, FIG. 2 shows a detailed circuit diagram, FIG. 3 shows the characteristic line course for the dependency of the sensor current from the distance to the measurement object to the sensor measurement surface with different conditions of the sensor in the electrically non-attenuated and electrically attenuated conditions of the sensor, and FIG. 4 shows the signal behavior with the cyclic switching in with the electric attenuation.

FIG. 1 shows an inductive proximity sensor 1 that has two electric supply lines 2 and 3. The measurement object, such as a switch rail tongue, which must consist of ferromagnetic, or electrically conductive material, is schematically implied by the number 4. Due to the currents measured, the distance a between the measurement object and the sensor surface can be closed by of the sensor 1.

Figure 2:
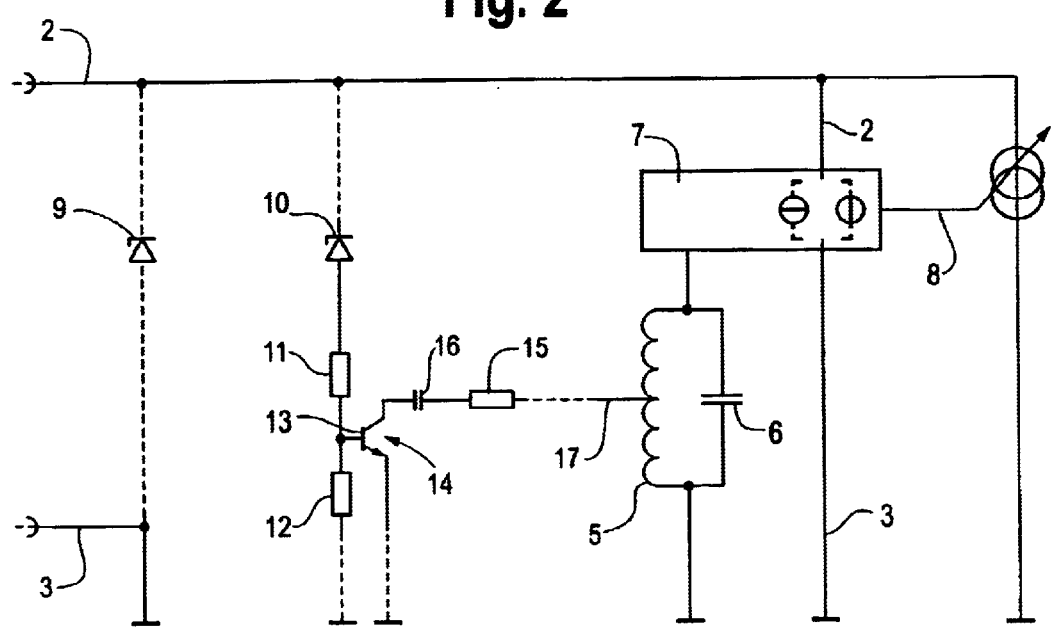

A principal circuit arrangement is illustrated in FIG. 2.

FIG. 2 shows a resonant circuit coil identified by the number 5, whereby the LC member characteristic for the resonant circuit has a condenser 6. A proximity of a measurement object to the coil 5 leads to a mechanical attenuation, whereby the oscillator is schematically identified by the number 7, and depending on the resonant amplitude, supplies a corresponding constant current that is supplied by means of the signal line 8.

In the measurement operation of this sensor in two wire circuit, the oscillator 7 is supplied by a constant current source, or a constant voltage source, and therefore shows no substantial changes with a change in the supply voltage. The supply voltage is fed via the line 2 and 3, whereby the first zener diode 9 is intended, with which voltage peaks are to be eliminated, which could lead to failures in the circuit arrangement. This first zener diode 9 is laid out for a higher forward voltage, than the second zener diode 10 illustrated in FIG. 2.

By increasing the supply voltage from typically 12 to 18 V to 22 V, for example, current can now flow across the resistances 11 and 12 forming a voltage separator, at a corresponding layout of the zener diode 10, and the base 13 of the transistor 14 can be made conductive in this way so that now current can flow across the resistance 15, the condenser 16, as well as the collector and the emitter of the transistor 14. As this resistance 15 is connected to the line 17 at a disassembled stare of the coil 5, an electric attenuation of the resonant circuit occurs in this case, by which the measured amplitude is changed, and additional signals may be gained by means of the line 8.

The constant current source or the constant voltage source, respectively, controls an amplifier that sounds the sensor signal in the form of an active current signal on the supply line. This amplifier also has no dependency on the voltage. Energy is withdrawn from the resonant circuit by means of tapping of a sensor coil at a switched in electric attenuation, whereby this energy loss that physically corresponds to a loss, which may be caused by eddy current and re-magnetizing losses at the sensor coil, leads to a change of the current readings before and after the defined attenuation, which may then be compared to the respective desired characteristic lines between both points.

Controlled voltage changes simultaneously allow a limited test of the sensor circuit, as well as of the cable routing.

A change in the current signal after the increase or decrease of the supply voltage would mean that either a defect in the cable routing, or in a circuit component of the sensor is present. If the sensor is cyclic tested, the amount of components responsible for the undetected failures of the sensor can be substantially reduced. Controlled by the zener diode 10, the transistor 14 is thereby used as a circuit that diverts energy from the resonant circuit via the resistance with a defined increase of the supply voltage. Such a circuit operation for the cyclic scanning of the electric attenuated measurement readings can be caused by the temporary increase of the sensor supply voltage. Any undesired parasitic resistances would lead to a current increase with the increased supply voltage, whereby such errors also become recognizable by the circuit arrangement.

The characteristic line courses are illustrated in FIG. 3 and FIG. 4.

FIG. 3 shows the first characteristic line 18, which mirrors the course of the current consumption in dependency of the mechanical attenuation. In a defective sensor, or one that is becoming defective, this current measurement reading decreasing according the curve 19, whereby it is simultaneously clear that the change in measurement readings at the maximum distance, i.e. in the mechanical non-attenuated condition of the sensor, becomes significantly low, and does not become noticeably measurable until the distance is decreased, and therefore the mechanical attenuation is increased. A defective sensor, the characteristic line course of which, for instance, corresponds to the curve 19, would then, however, if it is not recognized that the sensor is defective in a timely fashion, lead to the wrong proximity values, as the minimum current with the assembly of a tongue at point 20 would already be achieved at point 21 with an intact sensor on the characteristic line of the defective sensor, which would therefore result in too large of a distance in the corresponding evaluation.

The curve line 22 corresponds to an intact sensor with simultaneous additional electric attenuation. It has now been shown that that significant differences occur in a defective sensor with switched in electric attenuation corresponding to the curve course of the curve 23, even with the disassembly of the tongue, which point to a defective sensor. The difference, as measured for the disassembly of the tongue between the conditions without and with electric attenuation, corresponds here to the difference of the measurement currents b, while in the case of a defective sensor, this difference is significantly higher, and corresponds to c.

If now, as illustrated in FIG. 4, the electric attenuation is cyclically switched in, a signal course occurs for each intact sensor, which corresponds to the curve course 24 in FIG. 4, whereby clearly the decrease of the current consumption respectively registered with the circuitry of the transistor is evident. This decrease is indicated by the respective partial areas 25, 26, 27 28, 29, and 30, whereby this difference is simultaneously differs for the different mechanical attenuations of the sensor.

If a defective sensor is present, then the difference at the stared points of the curve course increases, whereby the additionally measured current difference is indicated by the curve course at the points 31, 32, 33, 34, 35, and 36. In this case, however, the difference is no longer based on the original characteristic line 24, but instead is recognizable as a measurement reading exactly based on the characteristic line 19 of the defective sensor.

From all of these signal difference, the required prognosis can be made, and particularly the failure probability of inductive proximity sensors for the monitoring of the position of movable switch rails or rail components can be quantified.

It is claimed:

1. Device for monitoring and prognosis of failure probability of inductive proximity sensors (1) for the monitoring of the position of movable switch rail or rail components, comprising a proximity sensor (1) having at least one coil (5) that is supplied by an oscillator (7), and which is measured by sensor current flowing by means of a variable attenuation, and is then fed to an evaluation circuit, wherein characteristic flues (18, 22) of the sensor (1) are stored in the electric not additionally attenuated condition (18), and, in the electric additionally attenuated condition (22) for the course of the sensor currents in dependency of the distance of the movable switch rails or rail components, namely, mechanical attenuation, and the measuring currents (24) corresponding to the mechanical attenuation condition, as well as to the respective additionally electric attenuated condition are cyclically scanned, and the respective measuring currents, or measurement reading pairs, are fed to a comparison and evaluation circuit, in which the differences due to the characteristic line are compared to measured differences.

2. The device of claim 1, wherein signals of the measurement reading pairs for at least two different mechanical attenuations are fed to the evaluation circuit.

3. The device of claim 2, wherein the electric attenuation occurs by means of increase of supply voltage.

4. The device of claim 3, wherein the electric attenuation occurs by means of a tap (17) of the sensor (5).

5. The device of claim 4, wherein a transistor (14) controls the electric attenuation by means of a resistance (15) at the tap (17) of the sensor coil (5), a base (13) of the transistor (14) being connected to the voltage source by means of a zener diode (10).

6. The device of claim 3, wherein a transistor (14) controls the electric attenuation by means of a resistance (15) at the tap (17) of the sensor coil (5), a base (13) of the transistor (14) being connected to the voltage source by means of a zener diode (10).

7. The device of claim 3, wherein at least one evaluation of the difference of the measurement reading pairs occurs in a mechanically non-attenuated condition.

8. The device of claim 2, wherein the electric attenuation occurs by means of a tap (17) of the sensor coil (5).

9. The device of claim 8, wherein a transistor (14) controls the electric attenuation by means of a resistance (15) at the tap (17) of the sensor coil (5), a base (13) of the transistor (14) being connected to the voltage source by means of a zener diode (10).

10. The device of claim 8, wherein at least one evaluation of the difference of the measurement reading pairs occurs in a mechanically non-attenuated condition.

11. The device of claim 2, wherein a transistor (14) controls the electric attenuation by means of a resistance (15) at the tap (17) of the sensor coil (5), a base (13) of the transistor (14) being connected to the voltage source by means of a zener diode (10).

12. The device of claim 11, wherein at least one evaluation of the difference of the measurement reading pairs occurs in a mechanically non-attenuated condition.

13. The device of claim 2, wherein at least one evaluation of the difference of the measurement reading pairs occurs in a mechanically non-attenuated condition.

14. The device of claim 1, wherein the electric attenuation occurs by means of increase of supply voltage.

15. The device of claim 14, wherein the electric attenuation occurs by means of a tap (17) of the sensor (5).

16. The device of claim 15, wherein a transistor (14) controls the electric attenuation by means of a resistance (15) at the tap (17) of the sensor coil (5), a base (13) of the transistor (14) being connected to the voltage source by means of a zener diode (10).

17. The device of claim 14, wherein a transistor (14) controls the electric attenuation by means of a resistance (15) at the tap (17) of the sensor coil (5), a base (13) of the transistor (14) being connected to the voltage source by means of a zener diode (10).

18. The device of claim 14, wherein at least one evaluation of the difference of the measurement reading pairs occurs in a mechanically non-attenuated condition.

19. The device of claim 1, wherein the electric attenuation occurs by means of a tap (17) of the sensor coil (5).

20. The device of claim 19, wherein a transistor (14) controls the electric attenuation by means of a resistance (15) at the tap (17) of the sensor coil (5), a base (13) of the transistor (14) being connected to the voltage source by means of a zener diode (10).

21. The device of claim 19, wherein at least one evaluation of the difference of the measurement reading pairs occurs in a mechanically non-attenuated condition.

22. The device of claim 1, wherein a transistor (14) controls the electric attenuation by means of a resistance (15) at the tap (17) of the sensor coil (5), a base (13) of the transistor (14) being connected to the voltage source by means of a zener diode (10).

23. The device of claim 22, wherein at least one evaluation of the difference of the measurement reading pairs occurs in a mechanically non-attenuated condition.

24. The device of claim 1, wherein at least one evaluation of the difference of the measurement reading pairs occurs in a mechanically non-attenuated condition.

* * * * *